US011799476B2

(12) United States Patent
Ogirko

(10) Patent No.: US 11,799,476 B2
(45) Date of Patent: Oct. 24, 2023

(54) CAPACITIVE TOUCH-SENSING CHANNEL

(71) Applicant: Cypress Semiconductor Corporation, San Jose, CA (US)

(72) Inventor: Roman Ogirko, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 286 days.

(21) Appl. No.: 16/911,746

(22) Filed: Jun. 25, 2020

(65) Prior Publication Data
US 2021/0226626 A1 Jul. 22, 2021

Related U.S. Application Data

(60) Provisional application No. 62/961,893, filed on Jan. 16, 2020.

(51) Int. Cl.
*G06F 3/041* (2006.01)
*H03K 17/96* (2006.01)
*G06F 3/044* (2006.01)

(52) U.S. Cl.
CPC ........... *H03K 17/962* (2013.01); *G06F 3/044* (2013.01); *G06F 3/0416* (2013.01); *H03K 2017/9613* (2013.01)

(58) Field of Classification Search
CPC .................. H03K 17/962; H03K 17/96; H03K 2017/9613; H03K 2217/96073; H03K 2217/960775; G06F 3/0416; G06F 3/041; G06F 3/044; G06F 3/0446; G06F 3/04182

See application file for complete search history.

(56) References Cited

U.S. PATENT DOCUMENTS

| | | | |
|---|---|---|---|
| 9,285,902 B1 * | 3/2016 | Kremin | G06F 3/041 |
| 2017/0242534 A1 * | 8/2017 | Gray | G06F 3/041662 |
| 2018/0113565 A1 * | 4/2018 | Chen | G06F 3/04182 |
| 2019/0171331 A1 * | 6/2019 | Gray | G06F 3/0418 |

* cited by examiner

*Primary Examiner* — Tarun Sinha
*Assistant Examiner* — James I Burris

(57) ABSTRACT

Technology directed to capacitive touch-sensing channels, including a capacitive-sensing converter based on a sigma-delta modulator, is described. One sigma-delta modulator includes a comparator, a first integrator coupled to receive an incoming signal from the input node and to provide a first output signal, a second integrator, coupled in parallel to the first integrator, to receive the incoming signal and to provide a second output signal, and switching circuitry. The switching circuitry is configured to selectively couple the first integrator between the input node and the comparator to provide the first output signal to the comparator or selectively couple the second integrator between the input node and the comparator to provide the second output signal to the comparator.

20 Claims, 11 Drawing Sheets

CAPACITIVE TOUCH-SENSING CHANNEL

RELATED APPLICATIONS

This application claims the benefit of U.S. Provisional Application No. 62/961,893, filed Jan. 16, 2020, the entire contents of which are incorporated by reference.

BACKGROUND

A touch sensor may be used to detect the presence and location of an object or the proximity of an object within a touch-sensitive area of the touch sensor. For example, touch-sensing circuitry may detect the presence and location of a touch object proximate to a touch sensor disposed in connection with a display screen. There are a number of different types of touch sensors. The types of touch sensor may include resistive touch sensors, surface acoustic wave touch sensors, capacitive touch sensors, inductive touch-sensing, and so forth. The different touch sensors may detect different types of objects.

Most touch-sensing applications require high-sensitivity to support a thick overlay over the touch sensor, operation of the touch sensor using a glove, or high-distance hover recognition at noisy conditions, such as caused by a nearby liquid crystal display (LCD), inductive loads switching, radio emissions, or the like. Moreover, the emission of the touch sensor is limited, which limits the excitation energy of the touch sensor to achieve a sufficient signal-to-noise ratio (SNR).

BRIEF DESCRIPTION OF THE DRAWINGS

The disclosure is illustrated by way of example, and not of limitation, in the figures of the accompanying drawings.

DETAILED DESCRIPTION

Figure 1:
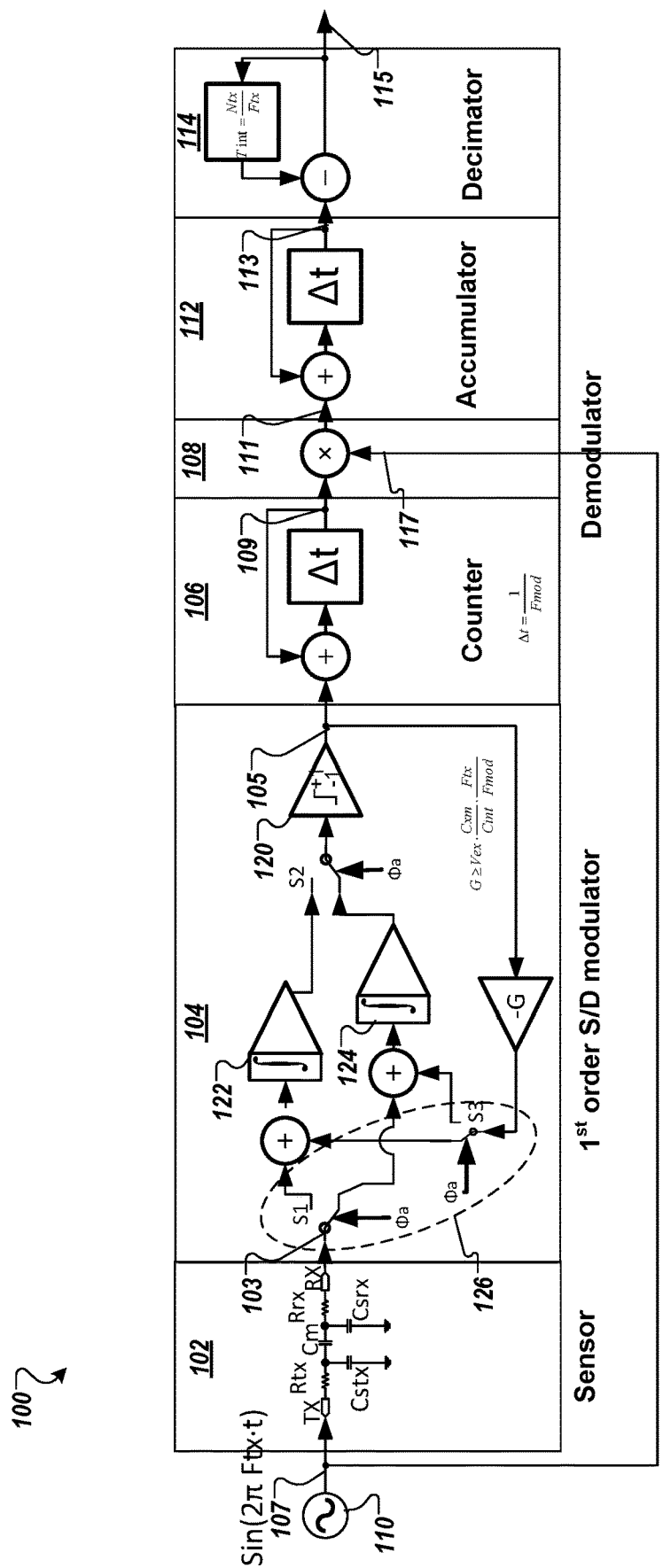
FIG. 1 is a functional diagram of a capacitive touch-sensing channel based on an accumulating first-order Sigma-Delta converter according to one embodiment.

The following description sets forth numerous specific details such as examples of specific systems, components, methods, and so forth, in order to provide a good understanding of various embodiments of the techniques described herein for capacitive touch-sensing channels, including a capacitive-sensing converter based on a sigma-delta modulator whose structure is modified to obtain an accumulating property of a sensing result, giving sensing resolution that is proportional to an integration duration. As described above, most of the touch-sensing applications require high-sensitivity. As described herein the embodiments can provide an increased immunity to external noise by using a sinusoidal demodulation window together with sinusoidal excitation, as well as increase the sensing resolution by increasing the integration duration. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Described herein are various embodiments of techniques for capacitive sensing. The embodiments may provide a sense unit (also referred to as a touch sensor) that may be used in connection with capacitive-sensing circuitry to detect different types of objects. In one embodiment, the sense unit can be used for mutual capacitive sensing or self-capacitance sensing. In one embodiment, the capacitive sensing circuitry (also referred to herein as "capacitive-sensing circuitry" or "sensing circuitry") may use a capacitive touch-sensing channel in a way that it can measure capacitance of the sense element (e.g., a single electrode with respect to a ground potential or between a receive (RX) electrode and a transmit (TX) electrode), as described in more detail herein. The sensing circuitry may also be configured to detect inductance of a sense element, such as to detect ferrous and non-ferrous metal objects proximate to the sense unit using inductive sensing techniques. Examples of devices that may use capacitive sensing may include, without limitation, automobiles, home appliances (e.g., refrigerators, washing machines, etc.), personal computers (e.g., laptop computers, notebook computers, etc.), mobile computing devices (e.g., tablets, tablet computers, e-reader devices, etc.), mobile communication devices (e.g., smartphones, cell phones, personal digital assistants, messaging devices, pocket PCs, etc.), connectivity and charging devices (e.g., hubs, docking stations, adapters, chargers, etc.), audio/video/data recording and/or playback devices (e.g., cameras, voice recorders, hand-held scanners, monitors, etc.), body-wearable devices, and other similar electronic devices.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the invention. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

FIG. 1 is a functional diagram of a capacitive touch-sensing channel 100 based on an accumulating first-order Sigma-Delta converter according to one embodiment. Capacitive touch-sensing channel 100 includes a sigma-delta modulator 104 coupled to an input node 103. Sigma-delta modulator 104 can be a first-order sigma-delta modulator. Input node 103 is coupled to a touch sensor 102. In one embodiment, touch sensor 102 includes a transmit (TX) electrode and a receive (RX) electrode, as represented as an equivalent circuit in FIG. 1. In another embodiment, touch sensor 102 includes a single electrode. Alternatively, other types of touch sensors can be used. An output 105 of sigma-delta modulator 104 is coupled to a counter 106, which is coupled to a demodulator 108. In one embodiment, a waveform generator 110 generates an excitation signal 107 that is applied to touch sensor 102, such as the TX electrode. Demodulator 108 is also configured to receive excitation signal 107 to demodulate an output 109 of counter 106. An accumulator 112 is coupled to an output 111 of demodulator 108 and a decimator 114 is coupled to an output 113 of accumulator 112. Decimator 114 outputs a digital result 115, such a digital count value, representing a capacitance of touch sensor 102.

As illustrated in FIG. 1, sigma-delta modulator 104 includes a comparator 120, a first integrator 122, a second integrator 124, and switching circuitry 126. First integrator 122 is coupled to comparator 120 and is configured to receive an incoming signal from input node 103 and a reference voltage and to provide a first output signal. Second integrator 124 is coupled to comparator 120, in parallel with first integrator 122. Second integrator 124 is configured to receive the incoming signal at input node 103 and to provide a second output signal. Switching circuitry 126 is configured to selectively couple first integrator 122 between input node 103 and comparator 120 in order to provide the first output signal to comparator 120 or selectively couple second integrator 124 between input node 103 and comparator 120 to provide the second output signal to comparator 120.

During operation, the incoming signal, in the form of a current comes into one of first integrator 122 or second integrator 124 and is balanced by a feedback-loop formed by a single-bit digitizer output, output 105, from comparator 120. In one embodiment, the feedback is expressed as −G, where G is expressed as follows:

$$G \geq Vex \cdot \frac{Cxm}{Cint} \cdot \frac{Ftx}{Fmod}$$

The input signal balancing procedure forms a bit-stream on output 105 that is input into counter 106. Counter 106 is an integrator in the digital form. Counter 106 reflects the digitized excitation signal scaled proportionally to the capacitance of touch sensor 102. Operation of counter 106 can be expressed as follows:

$$\Delta t = \frac{1}{Fmod}$$

Demodulator 108 multiplies the counter output and a digitized reference signal 117 that is coherent with excitation signal 107. The demodulated digitalized signal, at output 111, is integrated by accumulator 112 to get a magnitude of the sensed signal at output 113. Decimator 114 forms digital result 115 of the sensing during an integer number of excitation signal periods (Ntx). The components of capacitive touch-sensing channel 100 form an accumulating first-order Sigma-Delta converter that converts a capacitance of touch sensor 102 into a digital value that represents the capacitance. As described in more detail below, the accumulating first-order Sigma-Delta converter gives a property of a quantization error accumulation when samples are accumulated during several periods of excitation signal 107.

It should be noted that the channel transfer function of capacitive touch-sensing channel 100 is linear for a linear sweep of the sensed capacitance of touch sensor 102. In conventional sigma-delta converters, a quantization error of the sensed signal magnitude does not change if a conversion lasts longer and the dithering allows a reduction of the quantization error. That is, the capacitance touch-sensing channel 100 measures a signal magnitude. The signal-shape distortions can be reduced with additional filtering, but the resolution for the signal magnitude does not change in this way as it remains constant. One conversion of an excitation period (also referred to as a Tx period) defines a quantization step value due to the symmetry of the positive and negative half-periods' shape. The shape gives the same magnitude of the quantization error at the end of each half-period but different polarity. Finally, the quantization error at the end of the excitation signal period is equal to zero. Each following conversion must be considered as a separate conversion without the history from the previous conversion. The accumulation of conversions samples during the following periods of the excitation signal narrows down the channel pass-band but does not increase the resolution. Dithering is needed to make a result of each period conversion with a random part larger than one balancing step. In this case, the following accumulation of Ntx periods of the excitation signal gives the resolution increasing by sqrt(Ntx) times ($\sqrt{(Ntx)}$). In this solution, it is not possible to implement an anti-aliasing filter to prevent saturation by high-frequency noise. The channel frequency response can be affected by external noise, narrowing the channel pass-band down if the integration time (the decimation factor) increases. For example, when a high-frequency noise signal is injected into the channel, the injected noise generates a current on the input of the sigma-delta modulator that is bigger than the balancing current. This can significantly distort a conversion if an impulse noise impacts the touch sensor (for example an LCD noise). The saturation can be prevented if an anti-aliasing filter reduces the magnitude of the noise high-frequency components. The conventional sigma-delta converter, however, does not implement an anti-aliasing filter. Conventional solutions use higher-order modulators that can also saturate. The saturation occurs when the signal variation during the sampling period is bigger than a balancing signal. The conventional solutions require conversion of the sensor current into a voltage, followed by a filter. A high-order sigma-delta modulator can be used to get a sufficient overload ability, but the channel resolution decreases proportionally.

In contrast, the capacitive touch-sensing channel 100 is based on a sigma-delta modulator 104 whose bit-stream is integrated by counter 106 that is coherently demodulated by multiplying with sine data coherent with excitation signal 107, and the bit-stream is finally accumulated by accumulator 112. Sigma-delta modulator 104 includes an additional integrator, second integrator 124, which is in parallel to a main integrator, first integrator 122. The integrators are connected to the incoming signal and comparator 120 using switching circuitry 126. For example, a first switch S1 and a second switch S2 connect the incoming signal to comparator 120 through two branches. The switches S1 and S2 operate synchronously to form two branches from touch sensor 102 to comparator 120. One branch is through first integrator 122 when excitation signal 107 rises and another branch is through second integrator 124 when excitation signal 107 falls. The balancing feedback-loop is connected to the active branch with a third switch S3 that operates synchronously with switches S1 and S2.

In this manner, the integrators store the quantization error formed at the end of their active phase and each of the following active phases starts at the quantization condition of the previous active phase of the other integrator. This gives a property of the quantization error accumulation when samples are accumulated during several periods of the excitation signal 107, as illustrated in FIGS. 2A-B.

In another embodiment, the capacitive touch-sensing channel 100 can demodulate the sigma-delta modulator's bit stream by multiplying the bitstream with cosine data. In this case, the first digital integrator 106 can be removed. The cosine data can be multiplied by +1 and −1. The multiplication can be substituted by adding or subtracting the sine data. This method can provide an advantage of a wider channel baseband, such as two times wider the channel passband.

Figure 2A:
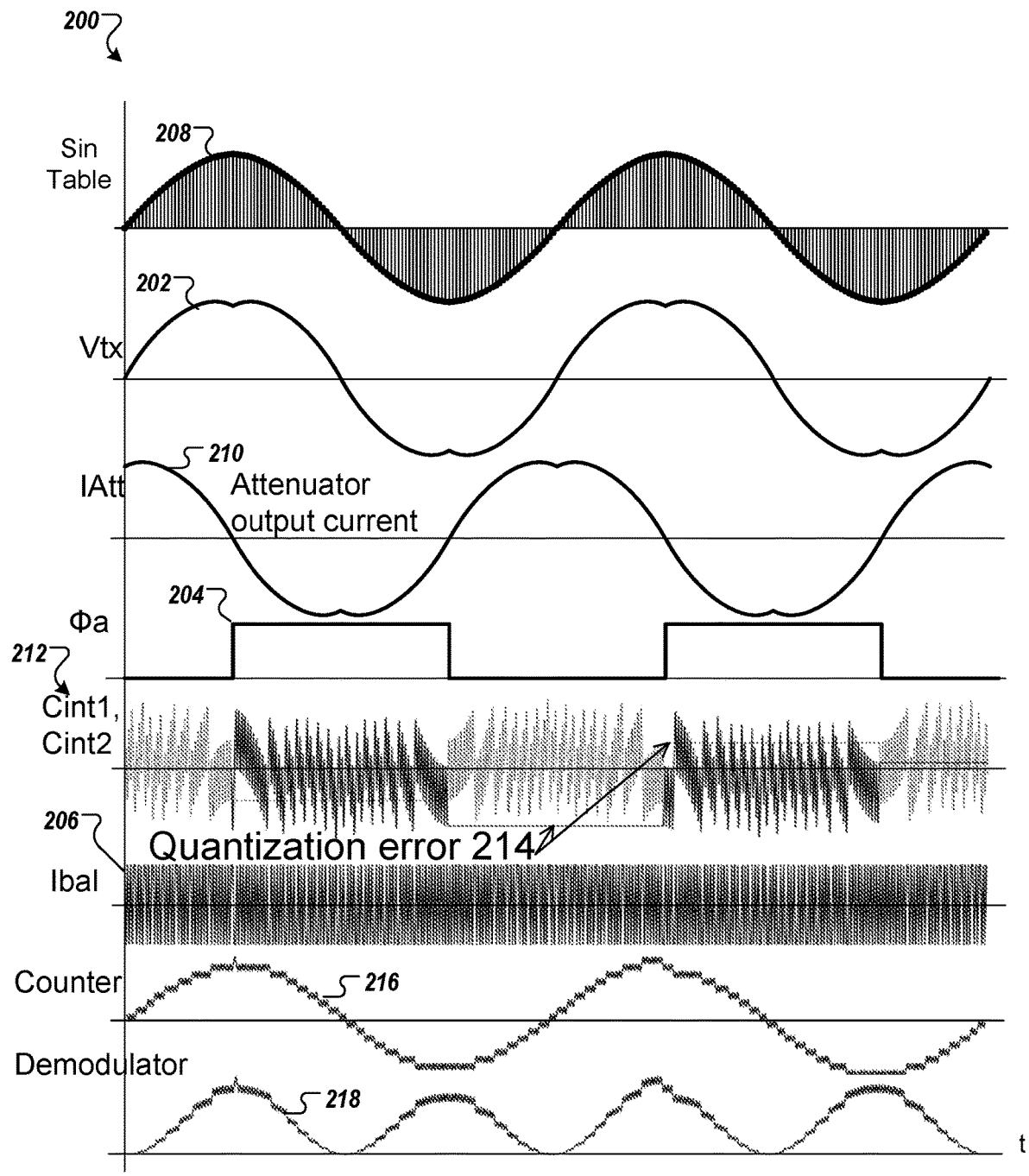
FIGS. 2A-2B are waveform diagrams of the accumulating first-order Sigma-Delta converter according to one embodiment.
Figure 2B:
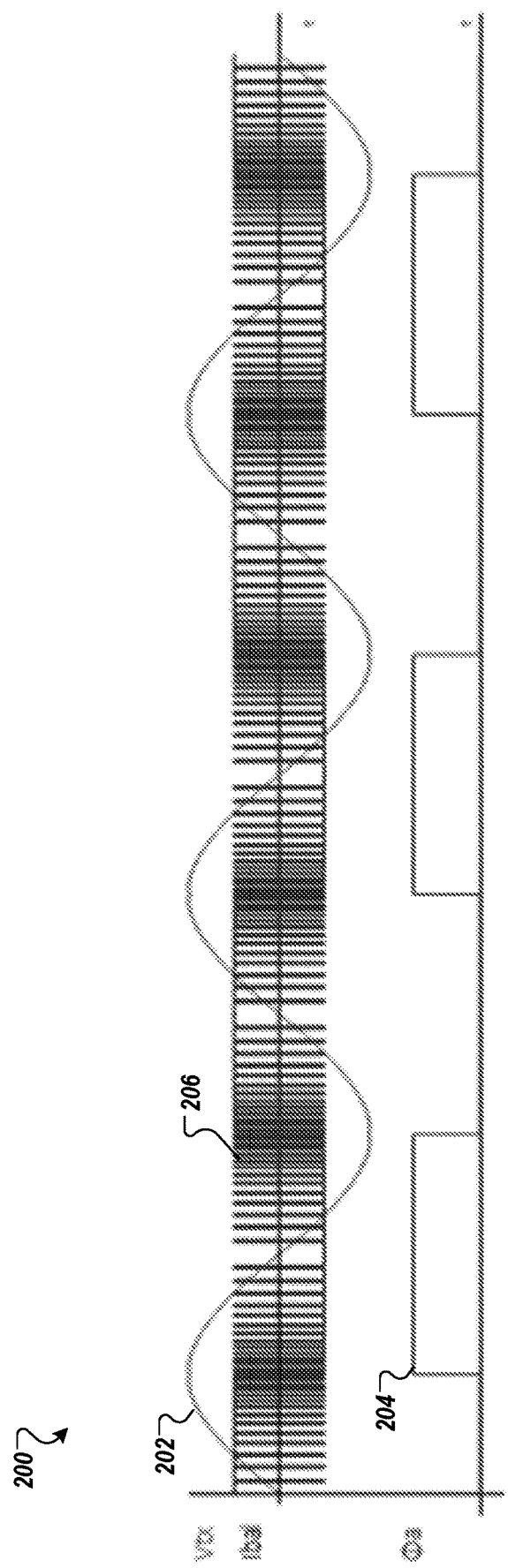

FIGS. 2A-2B are waveform diagrams 200 of the accumulating first-order Sigma-Delta converter according to one embodiment. In waveform diagram 200, an excitation signal 202 (labeled "Vtx") is a sine wave that rises and falls. Sine table 208 is the sine data that is coherent with excitation signal 202. While excitation signal 202 is rising, a switch control signal 204 (labeled as "θa") is in a first state (e.g., low state or logical 0). While excitation signal 202 is falling, switch control signal 204 is in a second state (e.g., high state or logical 1). Waveform diagram 200 shows an output current 210 of an attenuator, such as illustrated and described below with respect to FIG. 4A. Waveform diagram 200 also shows a balancing current signal 206 (labeled "Ibal") that increases and decreases in frequency through a period of excitation signal 202. Balancing current signal 206 represents the current used to balance the integrator based on the feedback-loop formed by the single-bit digitizer output, output 105, from comparator 120. Waveform diagram 200 shows signals 212 on the integrators, including quantization error 214 of the sensed magnitude. As described above, the signaling in FIGS. 2A-B allows the integrators of the accumulating first-order Sigma-Delta converter to store the quantization error formed at the end of their active phase and each of the following active phases start at the quantization error condition of the previous active phase of the integrator, resulting in quantization error accumulation. Waveform diagram 200 also shows an output 216 of the counter, and output 218 of the demodulator. FIG. 2B shows a zoomed-in view of excitation signal 202, switch control signal 204 and balancing current signal 206. The signaling in FIGS. 2A-B allows the capacitive sensing channel to be narrow-band and have a resolution that is proportional to the duration of the sensing period. Operation of the capacitive touch-sensing channel 100 based on an accumulating first-order Sigma-Delta converter can achieve an increased immunity to external noise by using a sinusoidal demodulation window in connection with a sinusoidal excitation. While conventional attempts do not allow increasing the resolution by increasing the sensing period (also referred to as sensing duration), capacitive touch-sensing channel 100 allows the resolution to be increase by increasing the sensing period. Capacitive touch-sensing channel 100 can be combine properties of a conventional capacitive touch-sensing channel that uses a sinusoidal excitation and a double-slope charge balancing converter based on a charge-transfer method. Capacitance touch-sensing channel 100, however replaces the double-slope charge balancing converter with an accumulated sigma-delta modulator as described herein.

Figure 3:
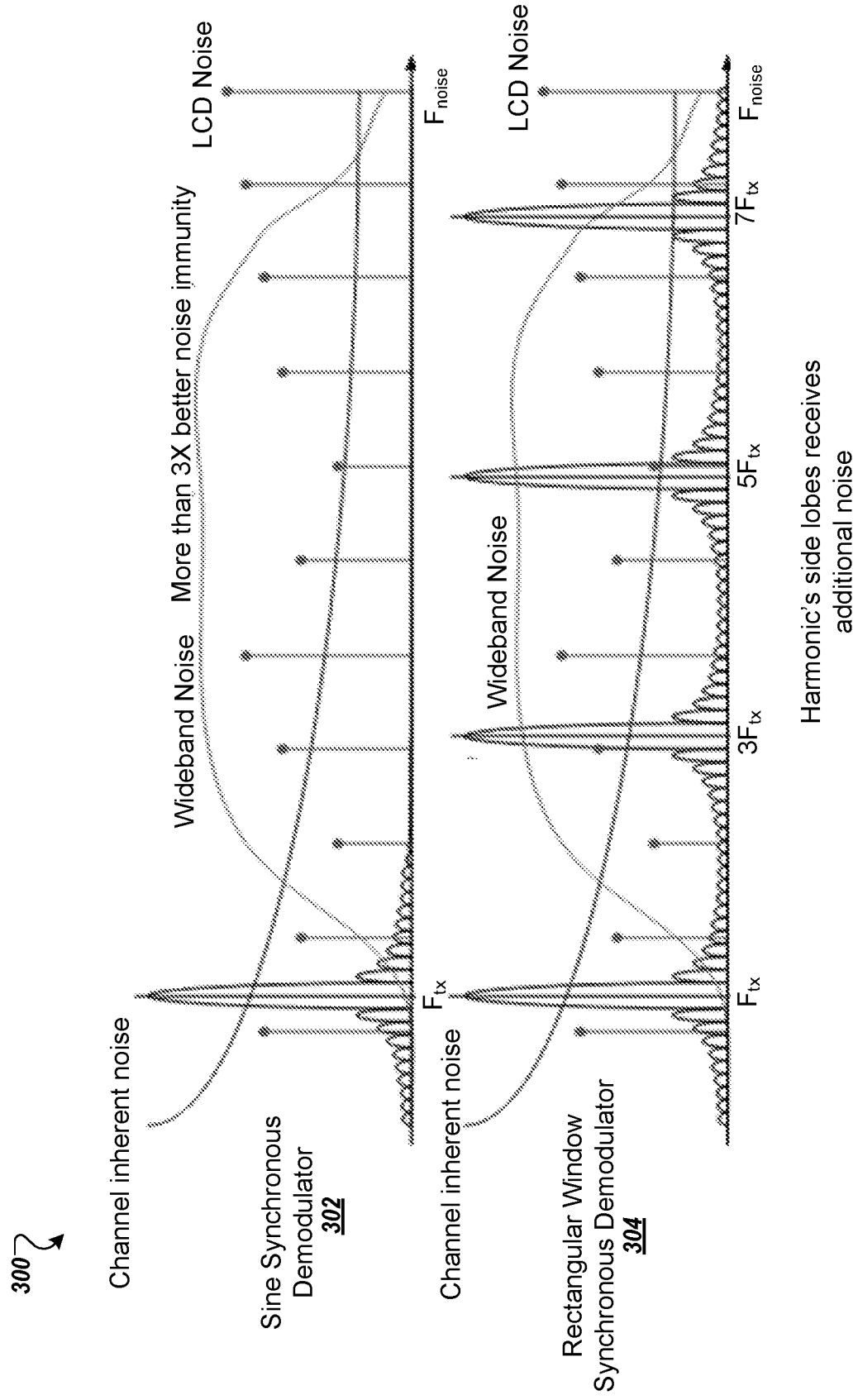
FIG. 3 is a waveform diagram of a noise transfer function according to one embodiment.

FIG. 3 is a waveform diagram 300 of a noise transfer function according to one embodiment. Waveform diagram 300 illustrates noise sources for a sine synchronous demodulator 302 and for a rectangular window synchronous demodulator 304. For sine excitation, the sinusoidal shape of the excitation signal generates a single tone emission which can be placed into a frequency range without strong limits for the emission. In order to have low harmonics content, a complex synthesizer can be used. A single lobe noise transfer function results in better immunity to noise and better SNR in high-sensitivity modes. The Fast Fourier Transform (FFT) of channel samples allows the ability to find a silent band for the frequency hopping, resulting in reliable operation in a noisy environment. Demodulation of the channel samples can be done by multiplying the samples with sine values in digital form. A processing element can be used to multiply the channel samples with the sine values in digital form. Alternatively, modifications to an existing channel engine can be made to multiply the channel samples. The channel engine can be firmware executed by a processing device coupled to the demodulator.

The following description is directed to an implementation of the functional operations described above with respect to FIGS. 1-2. For example, capacitive touch-sensing channel 100 can include two integrators that are each built using a current-to-current converter, as illustrated in in the accumulating first-order Sigma-Delta converter of FIGS. 4A-4C.

Figure 4A:
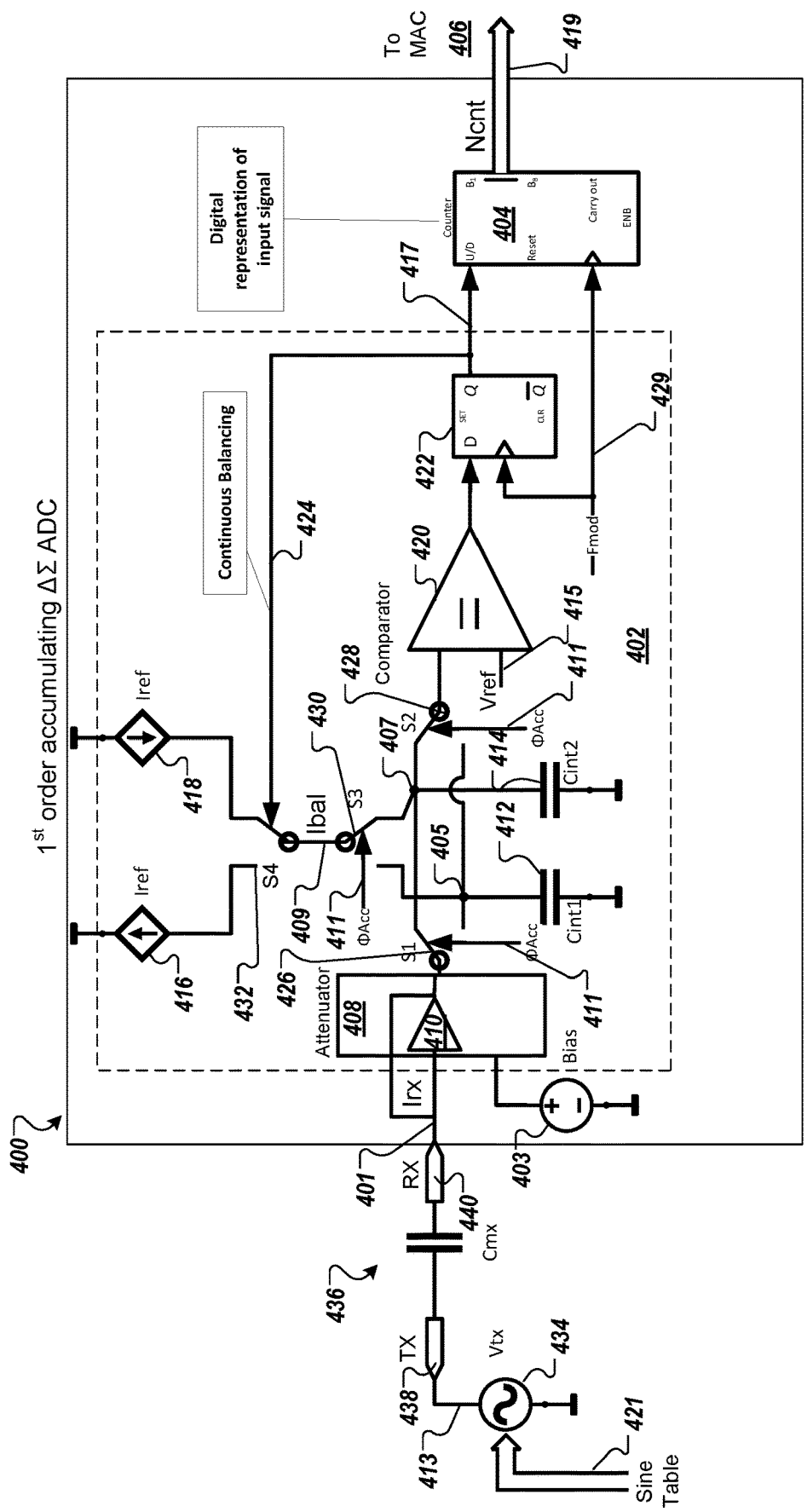
FIG. 4A-C are block diagrams of an accumulating first-order Sigma-Delta converter according to one embodiment.
Figure 4B:
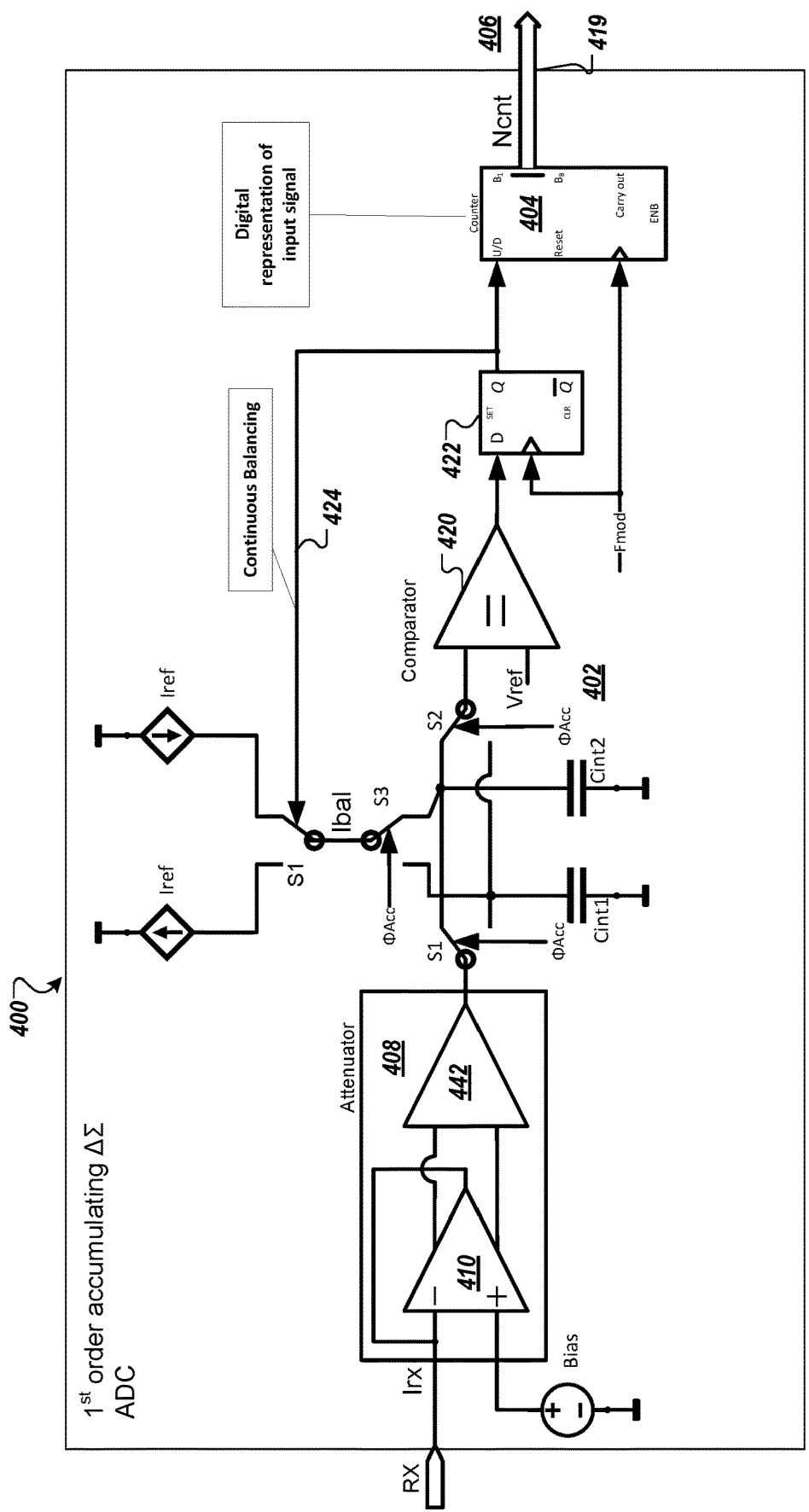
Figure 4C:
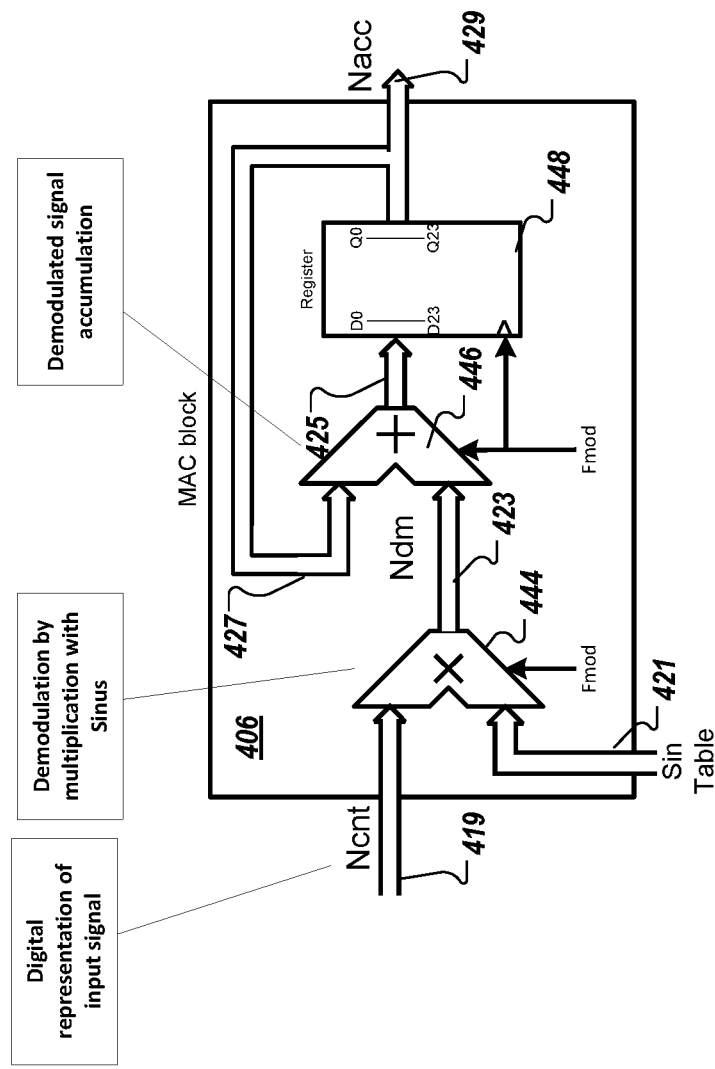

FIGS. 4A-C are block diagrams of an accumulating first-order Sigma-Delta converter 400 (hereinafter "converter 400") according to one embodiment. Converter 400 is hereinafter referred to as converter 400 for ease of description. Converter 400 is an analog-to-digital converter (ADC) that converts a current or charge from a touch sensor into a digital value. The ADC is a first-order converter because it has a first-order sigma-delta modulator 402 that measures feedback, representing quantization error, used for continuous balancing integrators. First-order sigma-delta modulator 402 is referred to below as sigma-delta modulator 402 for ease of description. A counter 404 is used to store a digital representation of the input signal. The output of counter 404 is multiplied and accumulated by a multiplication and accumulation circuit (MAC) 406, which is illustrated and described below with respect to FIG. 4C.

In one embodiment, sigma-delta modulator 402 can include two integrators that each includes an operational amplifier and an integrator capacitor. Alternatively, sigma-delta modulator 402 can include an attenuator 408, as illustrated in FIG. 4A, that allows an output current to stay in a suitable range, making it possible to use a unity-value balancing source.

As illustrated, sigma-delta modulator 402 includes attenuator 408 coupled to an input node 401 and a bias voltage 403. Attenuator 408 includes an amplifier (e.g., trans-impedance operational amplifier 410) that is common to a first integrator and a second integrator. Sigma-delta modulator 402 also includes a first integrator capacitor 412 coupled to a first node 405 and a second integrator 414 capacitor coupled to a second node 407. Sigma-delta modulator 402 also includes a first current source 416, a second current source 418, a comparator 420, and a flip-flop 422 coupled to an output of comparator 420 and coupled to an input of counter 404. An output of the flip-flop 422 is part of a balancing feedback loop 424 coupled to the switching circuitry. As illustrated in FIG. 4A, the switching circuitry includes: a first switch 426 coupled to attenuator 408, first node 405, and second node 407; a second switch 428 coupled to comparator 420, first node 405, and second node 407; a third switch 430 coupled to a third node 409, first node 405, and second node 407; a fourth switch 432 coupled to third node 409, first current source 416, and second current source 418. First switch 426, second switch 428, and third switch 430 are configured to operate synchronously. These switches can be controlled by a first control signal 411 (labeled "θAcc") that is dependent on an excitation signal 413. When excitation signal 413 is rising, first control signal 411 is low, causing first switch 426 and second switch 428 to couple an incoming signal to comparator 420 via first node 405, which is coupled to first integrator capacitor 412. When excitation signal 413 is falling, first control signal 411 is high, causing first switch 426 and second switch 428 to couple an incoming signal to comparator 420 via second node 407, which is coupled to second integrator 414. Third switch 430 is controlled by first control signal 411 to connect the balancing feedback loop 424 to first node 405 when excitation signal 413 is rising and to second node 407 when excitation signal 413 is falling. Fourth switch 432 is controlled by the output of flip-flop 422. The fourth switch 432 couples either first current source 416 or second current source 418 to third node 409 to balance the integrators. The balancing feedback loop 424 includes a balancing current signal 206 that controls the current sources to balance incoming signal. Comparator 420 compares the incoming signal, which includes the balanced feedback, against a voltage reference 415. Flip-flop 422 is clocked using a clock signal 429 (labeled as "Fmod"). The same clock signal is used by counter 404. As described above, the balancing current signal that is fed back to control fourth switch 432 represents the current used to balance the integrators based on the balancing feedback loop 424 formed by a single-bit digitizer output 417 that represents an output from comparator 420 that is sampled by flip-flop 422. The signaling of the balancing feedback loop 424 allows the integrators of the sigma-delta modulator 402 to store a quantization error formed at the end of their active phase and each of the following active phases start at the quantization error condition of the previous active phase of the integrator, resulting in quantization error accumulation. The counter 404 counts the single-bit digitizer output 417 over a sensing period and outputs a digital count value 419 to MAC 406, described below with respect to FIG. 4C.

In one embodiment, excitation signal 413 is generated by a waveform generator 434. Waveform generator 434 generates excitation signal 413 as a sinusoidal wave (also referred to as a sine wave). Input node 401 can be coupled to a touch sensor 436, including a first electrode 438 coupled to waveform generator 434 and a second electrode 440 coupled to input node 401. The switching circuitry is configured to form a first branch between touch sensor 436 and comparator 420 and a second branch between touch sensor 436 and comparator 420. The first branch is through the first integrator when excitation signal 413 rises and the second branch is through the second integrator when excitation signal 413 falls. The switching circuitry is further configured to couple balancing feedback loop 424 to the first branch when excitation signal 413 rises and to the second branch when excitation signal 413 falls. The first integrator is configured to store a quantization error formed at an end of a first active phase of the first integrator, and wherein the second integrator is configured to start at the quantization error at a start of a second active phase of the second integrator for a quantization error accumulation. In one embodiment, waveform generator 434 is controlled by control data 421 (labeled "sine table"). The control data can be stored in a sine wave table. The control data 421 is digital data that is coherent with excitation signal 413. The control data 421 is also used by the digital demodulator, described below with respect to FIG. 4C.

In another embodiment, the sigma-delta modulator includes a comparator, a first integrator coupled to receive an incoming signal from the input node and to provide a first output signal, a second integrator, coupled in parallel to the first integrator, to receive the incoming signal and to provide a second output signal, and switching circuitry to selectively couple the first integrator between the input node and the comparator to provide the first output signal to the comparator or selectively couple the second integrator between the input node and the comparator to provide the second output signal to the comparator. In a further embodiment, the switching circuitry includes a first switch coupled to provide the incoming signal to the first integrator or the second integrator and a second switch coupled to provide the first output signal to the comparator or the second output signal to the comparator. The first switch and the second switch are configured to operate synchronously.

In another embodiment, the sigma-delta modulator includes a balancing feedback loop coupled to the switching circuitry and the switching circuitry includes a first switch coupled to provide the incoming signal to the first integrator or the second integrator, a second switch coupled to provide the first output signal to the comparator or the second output signal to the comparator, and a third switch coupled to provide a balancing feedback signal from the balancing feedback loop to the incoming signal provided to the first integrator or the incoming signal provided to the second integrator. In this embodiment, the first switch, the second switch, and the third switch are configured to operate synchronously.

As illustrated in FIG. 4B, converter 400 includes a current-to-current converter (also referred to as an attenuator 408) that is based on a trans-impedance operational amplifier 410 with a 100% feedback loop and an output stage amplifier 442. That is, the trans-impedance operational amplifier 410 has a feedback loop. The attenuator 408 keeps an output current to be in a suitable range, making it possible to use a unity-value balancing source for continuously balancing.

As illustrated in FIG. 4C, converter 400 is coupled to MAC 406. MAC 406 can be one implementation of demodulator 108, accumulator 112 and decimator 114 of FIG. 1. MAC 406 includes a multiply circuit 444 that is coupled to counter 404 and an accumulation circuit 446 coupled to multiply circuit 444. Multiply circuit 444 is configured to demodulate digital count value 419 that is output by counter 404 by multiplying digital count value 419 by control data 421. The output of the multiply circuit 444 is a demodulated signal 423. Control data 421 is the sine data coherent to excitation signal 413 from waveform generator 434. Accumulation circuit 446 is configured to accumulate demodulated signal 423 by adding a current output 425 of the multiply circuit 444 to an accumulated value 427 that is already stored in a register 448. An output of accumulation circuit is stored in register 448 as an updated accumulated value 429 that is output from MAC 406.

Figure 4D:
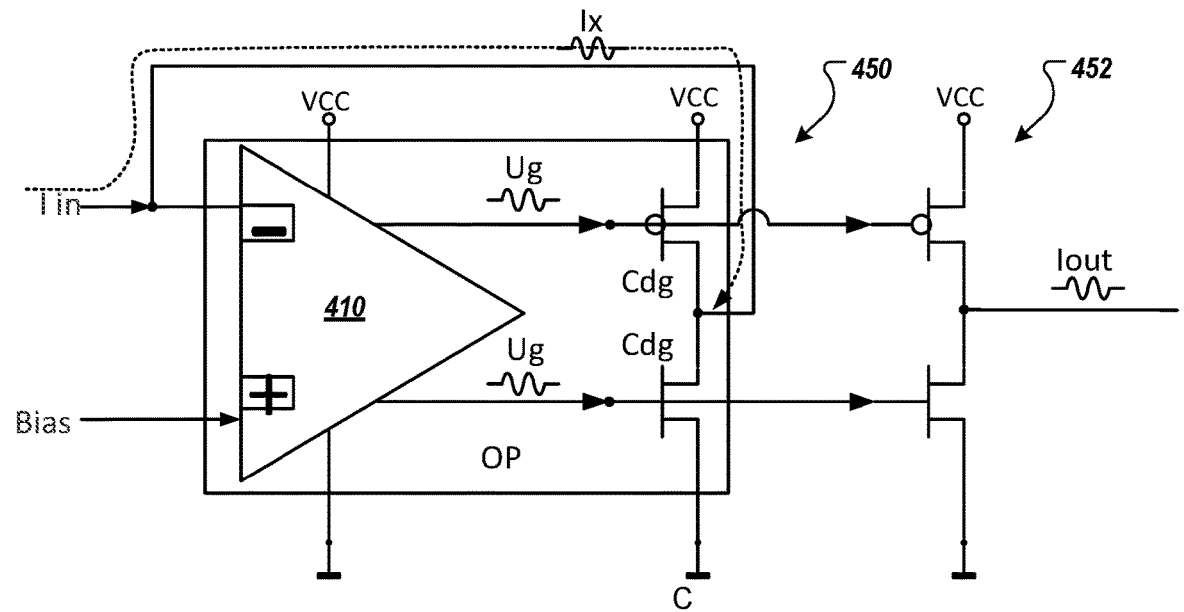
FIG. 4D is a schematic diagram of a current-to-current converter according to one embodiment.

FIG. 4D is a schematic diagram of the current-to-current converter 408 according to one embodiment. As illustrated in FIG. 4D, the trans-impedance operational amplifier 410 can include an output stage 450 of a first set of transistors and can be complemented with an additional output stage 452 of a second set of transistors that mirrors a current generated by the output stage 450 of the trans-impedance operational amplifier 410. The output current amplification or attenuation can be achieved by changing the number of transistors in the mirroring stage. The attenuation tuning allows keeping the output current in a suitable range making it possible to use a unity-value balancing source.

Figure 4E:
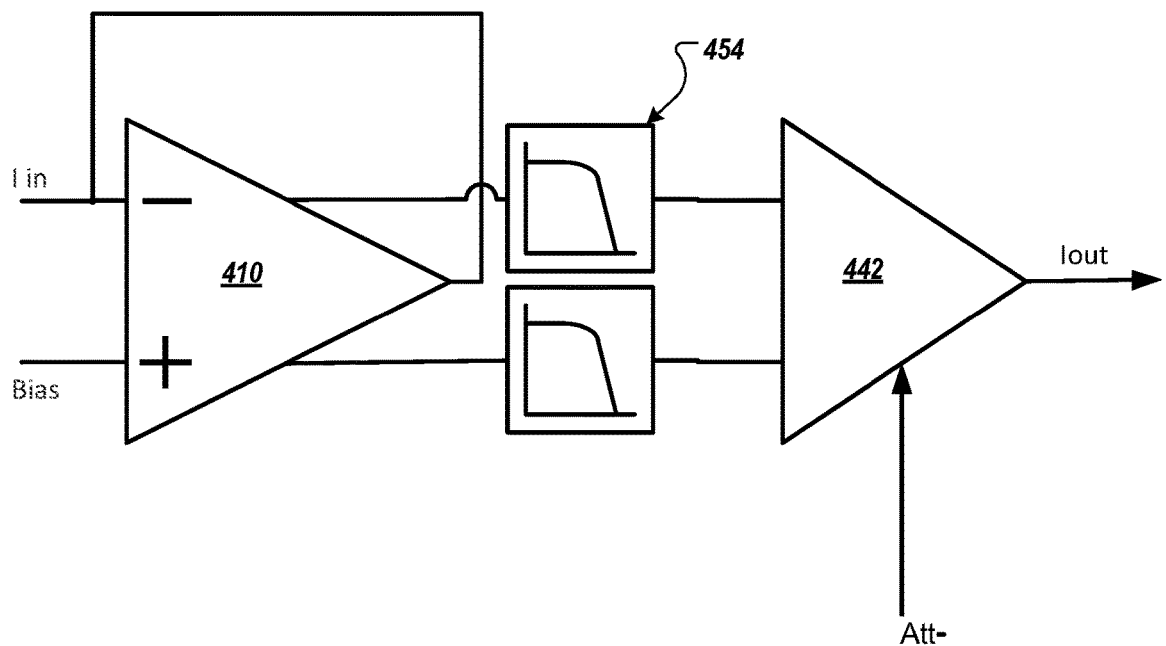
FIG. 4E is a schematic diagram of a current-to-current converter with low pass filters according to one embodiment.

FIG. 4E is a schematic diagram of a current-to-current converter with low pass filters 454 according to one embodiment. As illustrated in FIG. 4E, low-pass filters (LPFs) 454 can be added into the path of the driving signals. The LPFs 454 can suppress high-frequency noise components of the incoming current. The LPFs can operate as anti-aliasing filter.

Figure 5:
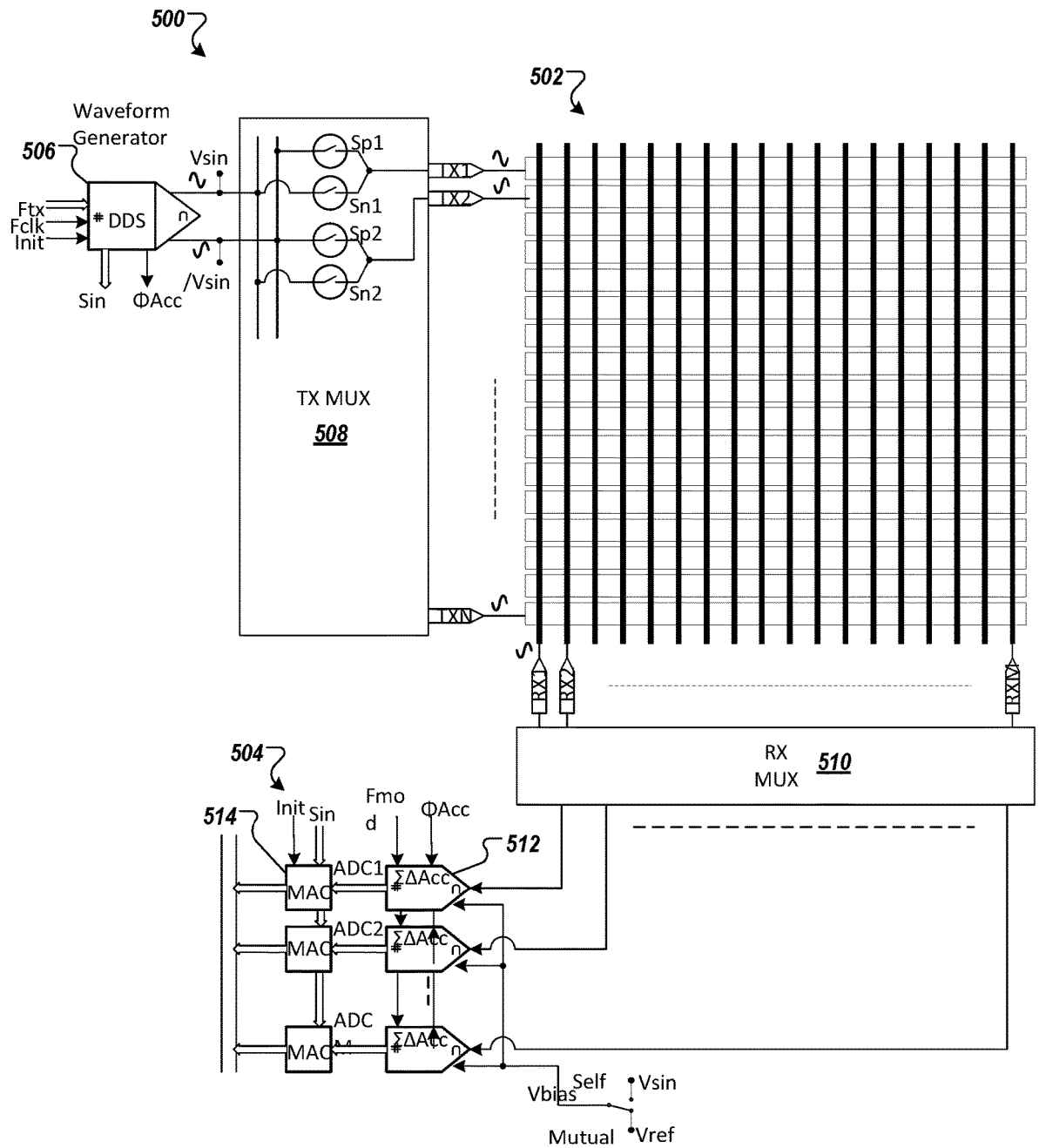
FIG. 5 is a touch system having an array of electrodes and multiple capacitive touch-sensing receive channels according to one embodiment.

FIG. 5 is a touch system 500 having an array 502 of electrodes and multiple capacitive touch-sensing channels 504 according to one embodiment. Touch system 500 includes an analog front-end (AFE) a capacitive touch-sensing controller, the controller being coupled to the array 502. The AFE includes a waveform generator 506 coupled to a first multiplexer circuit 508, a second multiplexer circuit 510 coupled to the multiple capacitive touch-sensing channels 504. Waveform generator 506 can be a direct digital synthesizer (DDS) that receive digital input, referred to as control data or sine data, and generates an excitation signal. The DDS can generates a DDS-based sine wave. The sine wave is different than a rectangular excitation signal as done conventionally. The excitation signal can be applied to any one of the electrodes of array 502 via the first multiplexer circuit 508. It should be noted that the first multiplexer circuit 508 can connect the direct output or the inverse output of waveform generator 506 to any sensor TX line according to a multiphase pattern. Any one of the multiple capacitive touch-sensing channels 504 can be coupled to any one of the electrodes of the array 502 via the second multiplexer circuit 510. Each of the multiple capacitive touch-sensing channels 504 can include an accumulated sigma-delta converter 512 and a MAC 514. Accumulated sigma-delta converter 512 is similar to accumulated sigma-delta converter 400 of FIGS. 4A-4C. MAC 514 is similar to the MAC 406 of FIGS. 4A-4C. As described herein, the accumulated sigma-delta converter 512 generates samples and the samples are multiplied with sine data coherent to excitation for demodulation by the MAC 514. Waveform generator 506 forms a half-period signal to drive the quantization error accumulation in the accumulated sigma-delta converter 512.

In another embodiment, a system includes a touch sensor having a first electrode and a second electrode and a capacitance touch-sensing controller coupled to the touch sensor. The capacitance touch-sensing controller includes a waveform generator coupled to the first electrode. The waveform generator generates an excitation signal, sine data coherent to the excitation signal, and a control signal indicative of the excitation signal rising or falling. A sensing channel is coupled to the second electrode at an input node. The sensing channel includes an accumulated sigma-delta analog-to-digital converter (ADC) to generate a digital value representing a capacitance of the touch sensor. The accumulated sigma-delta ADC can include a comparator, a first integrator coupled to receive an incoming signal from the input node and to provide a first output signal, a second integrator, coupled in parallel to the first integrator, to receive the incoming signal and to provide a second output signal, and switching circuitry to selectively couple the first integrator between the input node and the comparator to provide the first output signal to the comparator or selectively couple the second integrator between the input node and the comparator to provide the second output signal to the comparator. In a further embodiment, the accumulated sigma-delta ADC further includes a balancing feedback loop coupled to the switching circuitry. The switching circuitry can include a first switch coupled to provide the incoming signal to the first integrator or the second integrator, a second switch coupled to provide the first output signal to the comparator or the second output signal to the comparator, and a third switch coupled to provide a balancing feedback signal from the balancing feedback loop to the incoming signal provided to the first integrator or the incoming signal provided to the second integrator. The first switch, the second switch, and the third switch are configured to operate synchronously.

In another embodiment, the accumulated sigma-delta ADC includes a first-order sigma-delta modulator, including an attenuator coupled to the input node and a bias voltage. The attenuator can include an amplifier that is common to the first integrator and the second integrator. The accumulated sigma-delta ADC further includes a first integrator capacitor coupled to a first node, a second integrator capacitor coupled to a second node a first current source, a second current source, and a flip-flop coupled to an output of the comparator and coupled to an input of the counter. An output of the flip-flop is part of a balancing feedback loop coupled to the switching circuitry. In this embodiment, the switching circuitry includes: a first switch coupled to attenuator, the first node, and the second node; a second switch coupled to the comparator, the first node, and the second node; a third switch coupled to a third node, the first node, and the third node; and a fourth switch coupled to the third node, the first current source, and the second current source. The first switch, the second switch, and the third switch are configured to operate synchronously. The fourth switch is controlled by the output of the flip-flop.

In one embodiment, the first integrator is configured to store a quantization error formed at an end of a first active phase of the first integrator, and the second integrator is configured to start at the quantization error at a start of a second active phase of the second integrator for a quantization error accumulation.

In another embodiment, the accumulated sigma-delta ADC includes a first-order sigma-delta modulator that includes a first integrator capacitor, a second integrator capacitor, and a current-to-current converter. The current-to-current converter can include a trans-impedance operational amplifier with a feedback loop and a set of transistors of an output stage, coupled to the trans-impedance operational amplifier. The set of transistors mirrors a current signal generated by the trans-impedance operational amplifier. In a further embodiment, the current-to-current converter can further includes a set of LPFs coupled between the trans-impedance operational amplifiers and the set of transistors. The set of LPFs filter high-frequency components of the current signal. In this embodiment, the switching circuitry can be configured to form a first integrator by coupling the first integrator capacitor into a first branch between the current-to-current converter and the comparator and to form a second integrator by coupling the second integrator capacitor into a second branch between the current-to-current converter and the comparator. In a further embodiment, the switching circuitry is configured to allow the incoming signal through the first branch when an excitation signal rises, and allow the incoming signal through the second branch when the excitation signal falls. The switching circuitry can also be further configured to couple a balancing feedback loop to the first branch when the excitation signal rises and to the second branch when the excitation signal falls.

In another embodiment, the capacitive touch-sensing channel can further include a multiply-accumulation circuit that includes a register to store an accumulated value and a multiply circuit coupled to a counter of the modulator. The multiply-accumulation circuit includes a multiply circuit that demodulates an output of the counter by multiplying the output of the counter by sine data coherent to an excitation signal from a waveform generator. The multiply-accumulation circuit also includes an accumulation circuit coupled to the multiply circuit. The accumulation circuit accumulate a demodulated signal by adding a current output of the multiply circuit to the accumulated value to obtain an updated accumulated value and storing the updated accumulated value in the register.

Figure 6:
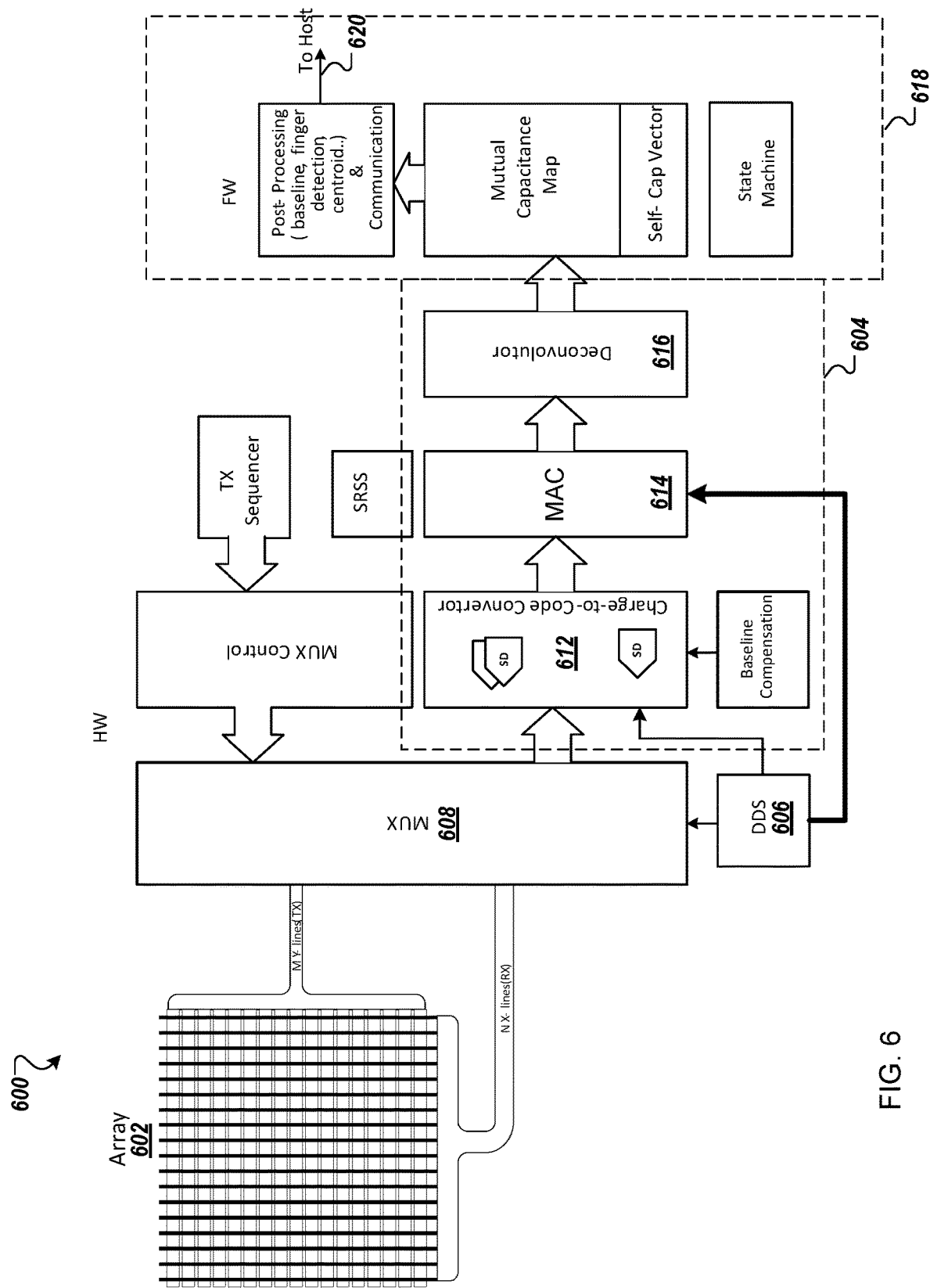
FIG. 6 is a touch system having an array of electrodes, multiple capacitive touch-sensing channels, and a processing device according to one embodiment.

FIG. 6 is a touch system 600 having an array 602 of electrodes, multiple capacitive touch-sensing channels 604, and a processing device 618 according to one embodiment. Touch system 600 includes a waveform generator 606 coupled to a multiplexer circuit 608. The multiplexer circuit 608 may represent first multiplexer circuit 508 and second multiplexer circuit 510 of FIG. 5. The multiplexer circuit 608 is used to couple the waveform generator 606 to any one or more electrodes of the array 602, as well as couple any one or more electrodes of the array 602 to one of the multiple capacitive touch-sensing channels 604. Waveform generator 606 can be a DDS that receive digital input, referred to as control data or sine data, and generates an excitation signal. The control data is also sent to the capacitive touch-sensing channels 604. As described herein, the excitation signal is a sine wave. It should be noted that the multiplexer circuit 608 can connect the direct output or the inverse output of waveform generator 606 to any sensor TX line according to a multiphase pattern. Any one of the multiple capacitive touch-sensing channels 604 can be coupled to any one of the electrodes of the array 602 via the multiplexer circuit 608. Each of the multiple capacitive touch-sensing channels 604 can include an accumulated sigma-delta converter 612 and a MAC 614. Accumulated sigma-delta converter 612 is similar to accumulated sigma-delta converter 400 of FIGS. 4A-4C. MAC 614 is similar to the MAC 406 of FIGS. 4A-4C. Because a multiphase pattern can be used, the capacitive touch-sensing channels 604 can include a deconvolution circuit 616 coupled to an output of MACs 614. As described herein, the accumulated sigma-delta converter 612 generates samples and the samples are multiplied with sine data coherent to excitation for demodulation by the MAC 614. The deconvolution circuit 616 can perform deconvolution on the sampled data. Waveform generator 606 forms a half-period signal to drive the quantization error accumulation in the accumulated sigma-delta converter 612.

Touch system 600 can also include processing device 618 that receives the digital output from the multiple capacitive touch-sensing channels 604. Processing device 618 can be a processor, a controller, hardware circuits that can perform further processing of the digital data. In one embodiment, processing device 618 executes firmware that includes post processing logic, communication logic, mutual capacitance mapping, self-capacitor vector generator, or the like. Processing device 618 can include a state machine. The processing device 618 can output data to a host 620 after processing the digital data. Touch system 600 can include other components, such as control circuitry to control the multiplexer circuit 608, a sequencer to sequence through the electrodes of the array 602, a baseline compensation circuit, or the like.

Figure 7:
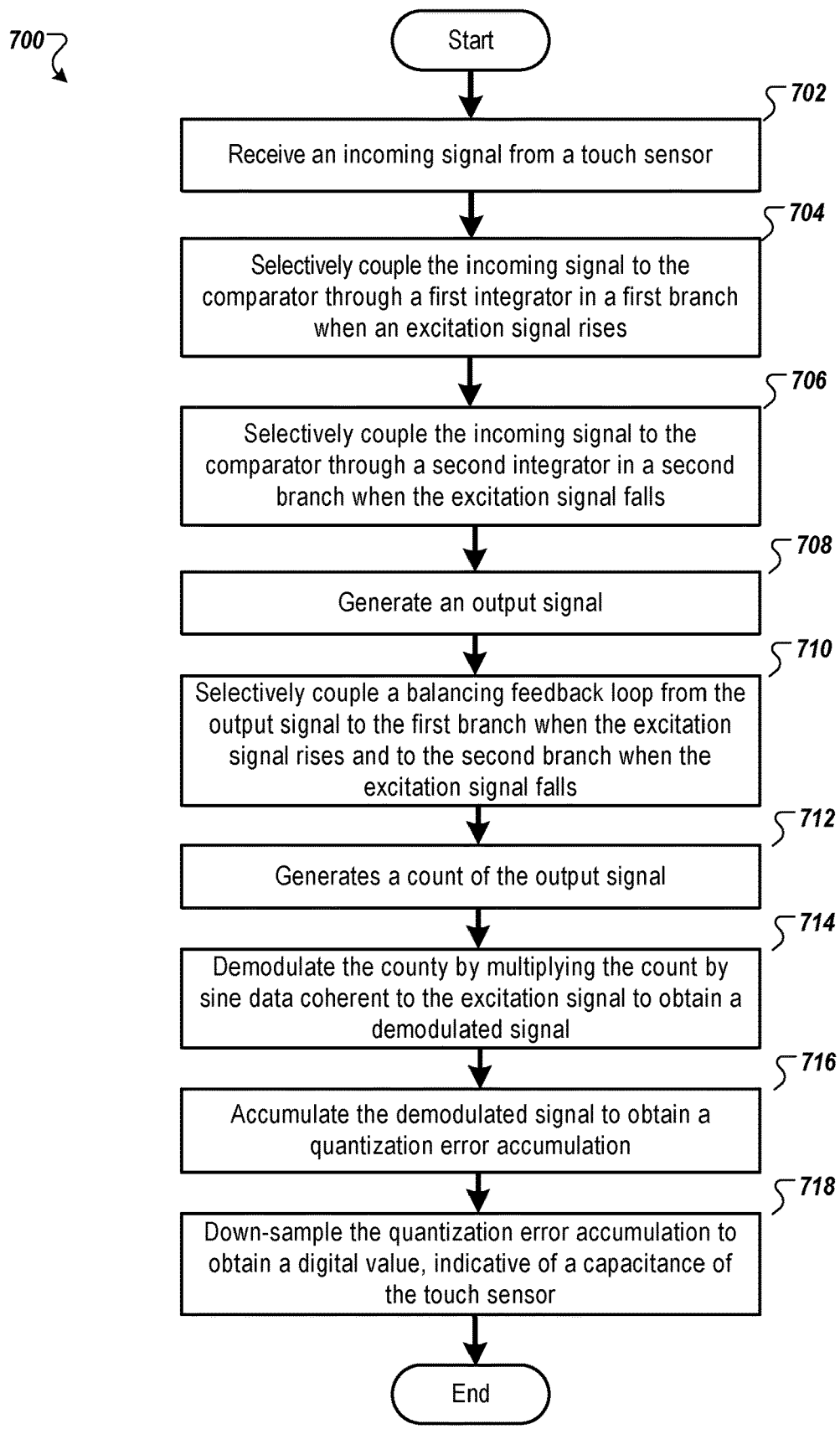
FIG. 7 is a method of operating an accumulating first-order Sigma-Delta converter according to one embodiment.

FIG. 7 is a method of operating an accumulating first-order Sigma-Delta converter according to one embodiment. The method 700 may be performed by processing logic that comprises hardware (e.g., circuitry, dedicated logic, programmable logic, microcode, etc.), software, firmware, or a combination thereof. In one embodiment, the method 700 may be performed by any of the processing devices described herein. In one embodiment, the method 700 is performed by capacitive touch-sensing channel 100 of FIG. 1. In another embodiment, the method 700 is performed by accumulating first-order Sigma-Delta converter 400 of FIG. 4A-4E. In another embodiment, the method 700 is performed by a device that includes the capacitive touch-sensing channel and a processing device coupled to the capacitive touch-sensing channel.

The method 700 begins by the processing logic receiving, by sigma-delta modulator of a capacitive-sensing channel, an incoming signal from a touch sensor (block 702). The sigma-delta modulator comprising a comparator, a first integrator, and a second integrator. The processing logic selectively couples, by switching circuitry of the capacitive-sensing channel, the incoming signal to the comparator through a first integrator in a first branch when an excitation signal rises (block 704). The processing logic selectively couples, by the switching circuitry, the incoming signal to the comparator through a second integrator in a second branch when the excitation signal falls (block 706). The processing logic generates, by the comparator, an output signal (block 708). The processing logic selectively couples, by the switching circuitry, a balancing feedback loop from the output signal of the comparator to the first branch when the excitation signal rises and to the second branch when the excitation signal falls (block 710). The processing logic generates a count of the output signal (block 712). The processing logic demodulates the count by multiplying the count by sine data coherent to the excitation signal to obtain a demodulated signal (block 714). The processing logic accumulates the demodulated signal to obtain a quantization error accumulation (block 716). The processing logic down-samples the quantization error accumulation to obtain a digital value (block 718), and the method 700 ends. The digital value is indicative of a capacitance associated with the touch sensor.

In a further embodiment, the processing logic selectively couples the incoming signal to the comparator through the first integrator by controlling a first switch and a second switch to couple the input node and the comparator to a first node coupled to a first integrator capacitor. The processing logic selectively couples the incoming signal to the comparator through the second integrator by controlling the first switch and the second switch to couple the input node and the compactor to a second node coupled to a second integrator capacitor. In a further embodiment, the processing logic selective couples the balancing feedback loop from the output signal of the comparator to the first branch and to the second branch by controlling a third switch to couple a third node to the first node or the second node and controlling a fourth switch to couple a first current source or a second current source to the third node based on the output signal.

In the above description, some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining", "allocating," "dynamically allocating," "redistributing," "ignoring," "reallocating," "detecting," "performing," "polling," "registering," "monitoring," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The methods and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A circuit comprising:
   an input node coupled to a touch sensor;
   a sigma-delta modulator coupled to the input node, wherein the sigma-delta modulator comprises:
   a comparator;
   a first integrator coupled to receive an incoming signal from the input node and to provide a first output signal, wherein the first integrator has a first integration duration;
   a second integrator, coupled in parallel to the first integrator, to receive the incoming signal and to provide a second output signal, wherein the second integrator has a second integration duration; and
   switching circuitry to selectively couple the first integrator between the input node and the comparator responsive to an excitation signal rising to provide the first output signal to the comparator or selectively couple the second integrator between the input node and the comparator responsive to the excitation signal falling to provide the second output signal to the comparator, wherein each of the first integration duration and the second integration duration is directly proportional to a sensing resolution of the touch sensor.

2. The circuit of claim 1, further comprising:
   a counter coupled to the sigma-delta modulator;

a demodulator coupled to the counter;
an accumulator coupled to the demodulator; and a decimator coupled to the accumulator, the decimator to output a digital signal indicative of a capacitance of the touch sensor, wherein the switching circuitry comprises:
   a first switch coupled to provide the incoming signal to the first integrator or the second integrator; and
   a second switch coupled to provide the first output signal to the comparator or the second output signal to the comparator, wherein the first switch and the second switch are configured to operate synchronously.

3. The circuit of claim 1, wherein the sigma-delta modulator comprises a balancing feedback loop coupled to the switching circuitry, wherein the switching circuitry comprises:
   a first switch coupled to provide the incoming signal to the first integrator or the second integrator;
   a second switch coupled to provide the first output signal to the comparator or the second output signal to the comparator; and
   a third switch coupled to provide a balancing feedback signal from the balancing feedback loop to the incoming signal provided to the first integrator or the incoming signal provided to the second integrator, wherein the first switch, the second switch, and the third switch are configured to operate synchronously.

4. The circuit of claim 1, wherein the sigma-delta modulator is a first-order sigma-delta modulator, wherein the first-order sigma-delta modulator comprises:
   a counter;
   an attenuator coupled to the input node and a bias voltage, wherein the attenuator comprises an amplifier that is common to the first integrator and the second integrator;
   a first integrator capacitor coupled to a first node;
   a second integrator capacitor coupled to a second node;
   a first current source;
   a second current source; and
   a flip-flop coupled to an output of the comparator and coupled to an input of the counter, wherein an output of the flip-flop is part of a balancing feedback loop coupled to the switching circuitry, and wherein the switching circuitry comprises:
      a first switch coupled to the attenuator, the first node, and the second node;
      a second switch coupled to the comparator, the first node, and the second node;
      a third switch coupled to a third node, the first node, and the second node; and
      a fourth switch coupled to the third node, the first current source, and the second current source, wherein the fourth switch is controlled by the output of the flip-flop, and wherein the first switch, the second switch, and the third switch are configured to operate synchronously.

5. The circuit of claim 1, further comprising a waveform generator that generates the excitation signal, the excitation signal comprising a sine wave, wherein the touch sensor comprises a first electrode coupled to the waveform generator and a second electrode coupled to the input node, wherein the switching circuitry is configured to form a first branch between the touch sensor and the comparator and a second branch between the touch sensor and the comparator, wherein the first branch is through the first integrator when the excitation signal rises and the second branch is through the second integrator when the excitation signal falls, wherein the switching circuitry is further configured to couple a balancing feedback loop to the first branch when the excitation signal rises and to the second branch when the excitation signal falls.

6. The circuit of claim 1, wherein the first integrator is configured to store a quantization error formed at an end of a first active phase of the first integrator, and wherein the second integrator is configured to start at the quantization error at a start of a second active phase of the second integrator for a quantization error accumulation.

7. The circuit of claim 1, wherein the sigma-delta modulator comprises:
   a first integrator capacitor;
   a second integrator capacitor; and
   a current-to-current converter comprising:
      a trans-impedance operational amplifier with a feedback loop;
      a set of transistors of an output stage, coupled to the trans-impedance operational amplifier, that mirrors a current signal generated by the trans-impedance operational amplifier; and
      a set of low-pass filters (LPFs) coupled between the trans-impedance operational amplifier and the set of transistors, the set of LPFs to filter high-frequency components of the current signal, wherein the switching circuitry is configured to form the first integrator by coupling the first integrator capacitor into a first branch between the current-to-current converter and the comparator, wherein the switching circuitry is configured to form the second integrator by coupling the second integrator capacitor into a second branch between the current-to-current converter and the comparator.

8. The circuit of claim 7, wherein the switching circuitry is configured to allow the incoming signal through the first branch when the excitation signal rises, and wherein the switching circuitry is configured to allow the incoming signal through the second branch when the excitation signal falls, wherein the switching circuitry is further configured to couple a balancing feedback loop to the first branch when the excitation signal rises and to the second branch when the excitation signal falls.

9. The circuit of claim 1, further comprising:
   a counter coupled to the sigma-delta modulator;
   a multiply-accumulation circuit;
   a decimator coupled to the multiply-accumulation circuit, the decimator to output a digital signal indicative of a capacitance of the touch sensor, wherein the multiply-accumulation circuit comprises:
      a register to store an accumulated value;
      a multiply circuit coupled to a counter of the sigma-delta modulator, the multiply circuit to demodulate an output of the counter by multiplying the output of the counter by sine data coherent to the excitation signal from a waveform generator; and
      an accumulation circuit coupled to the multiply circuit, the accumulation circuit to accumulate a demodulated signal by adding a current output of the multiply circuit to the accumulated value to obtain an updated accumulated value and storing the updated accumulated value in the register.

10. A system comprising:
   a touch sensor comprising a first electrode and a second electrode; and a capacitance touch-sensing controller coupled to the touch sensor, the capacitance touch-sensing controller comprising:
  a waveform generator coupled to the first electrode, the waveform generator to generate an excitation signal, sine data coherent to the excitation signal, and a control signal indicative of the excitation signal rising or falling;
  a sensing channel coupled to the second electrode at an input node, the sensing channel comprising an accumulated sigma-delta analog-to-digital converter to generate a digital value representing a capacitance of the touch sensor, wherein the accumulated sigma-delta analog-to-digital converter comprises:
    a comparator;
    a first integrator coupled to receive an incoming signal from the input node and to provide a first output signal, wherein the first integrator has a first integration duration;
    a second integrator, coupled in parallel to the first integrator, to receive the incoming signal and to provide a second output signal, wherein the second integrator has a second integration duration; and
    switching circuitry to selectively couple the first integrator between the input node and the comparator responsive to the excitation signal rising to provide the first output signal to the comparator or selectively couple the second integrator between the input node and the comparator responsive to the excitation signal falling to provide the second output signal to the comparator, wherein each of the first integration duration and the second integration duration is directly proportional to a sensing resolution of the touch sensor.

11. The system of claim 10, wherein the accumulated sigma-delta analog-to-digital converter comprises a balancing feedback loop coupled to the switching circuitry, wherein the switching circuitry comprises:
  a first switch coupled to provide the incoming signal to the first integrator or the second integrator;
  a second switch coupled to provide the first output signal to the comparator or the second output signal to the comparator; and
  a third switch coupled to provide a balancing feedback signal from the balancing feedback loop to the incoming signal provided to the first integrator or the incoming signal provided to the second integrator, wherein the first switch, the second switch, and the third switch are configured to operate synchronously.

12. The system of claim 10, wherein the accumulated sigma-delta analog-to-digital converter comprises a first-order sigma-delta modulator, wherein the first-order sigma-delta modulator comprises:
  a counter coupled to an output of the comparator, the counter to output the digital value;
  an attenuator coupled to the input node and a bias voltage, wherein the attenuator comprises an amplifier that is common to the first integrator and the second integrator;
  a first integrator capacitor coupled to a first node;
  a second integrator capacitor coupled to a second node;
  a first current source;
  a second current source; and
  a flip-flop coupled to an output of the comparator and coupled to an input of the counter, wherein an output of the flip-flop is part of a balancing feedback loop coupled to the switching circuitry, and wherein the switching circuitry comprises:
    a first switch coupled to the attenuator, the first node, and the second node;
    a second switch coupled to the comparator, the first node, and the second node;
    a third switch coupled to a third node, the first node, and the second node; and
    a fourth switch coupled to the third node, the first current source, and the second current source, wherein the fourth switch is controlled by the output of the flip-flop, and wherein the first switch, the second switch, and the third switch are configured to operate synchronously.

13. The system of claim 10, wherein the first integrator is configured to store a quantization error formed at an end of a first active phase of the first integrator, and wherein the second integrator is configured to start at the quantization error at a start of a second active phase of the second integrator for a quantization error accumulation.

14. The system of claim 10, wherein the accumulated sigma-delta analog-to-digital converter comprises a first-order sigma-delta modulator, wherein the first-order sigma-delta modulator comprises:
  a first integrator capacitor;
  a second integrator capacitor; and
  a current-to-current converter comprising:
    a trans-impedance operational amplifier with a feedback loop;
    a set of transistors of an output stage, coupled to the trans-impedance operational amplifier, that mirrors a current signal generated by the trans-impedance operational amplifier; and
    a set of low-pass filters (LPFs) coupled between the trans-impedance operational amplifier and the set of transistors, the set of LPFs to filter high-frequency components of the current signal, wherein the switching circuitry is configured to form the first integrator by coupling the first integrator capacitor into a first branch between the current-to-current converter and the comparator, wherein the switching circuitry is configured to form the second integrator by coupling the second integrator capacitor into a second branch between the current-to-current converter and the comparator.

15. The system of claim 14, wherein the switching circuitry is configured to allow the incoming signal through the first branch when the excitation signal rises, and wherein the switching circuitry is configured to allow the incoming signal through the second branch when the excitation signal falls, wherein the switching circuitry is further configured to couple a balancing feedback loop to the first branch when the excitation signal rises and to the second branch when the excitation signal falls.

16. The system of claim 10, wherein the sensing channel further comprises:
  a counter;
  a multiply-accumulation circuit, wherein the multiply-accumulation circuit comprises:
    a register to store an accumulated value;
    a multiply circuit coupled to the counter, the multiply circuit to demodulate an output of the counter by multiplying the output of the counter by sine data coherent to the excitation signal from the waveform generator; and
    an accumulation circuit coupled to the multiply circuit, the accumulation circuit to accumulate a demodulated signal by adding a current output of the multiply circuit to the accumulated value to obtain an updated accumulated value and storing the updated accumulated value in the register.

17. A method comprising:

receiving, by sigma-delta modulator of a capacitive-sensing channel, an incoming signal from a touch sensor, the sigma-delta modulator comprising a comparator, a first integrator, and a second integrator;

selectively coupling, by a switching circuitry of the capacitive-sensing channel, the incoming signal to the comparator through the first integrator in a first branch when an excitation signal rises, wherein the first integrator is selectively coupled to the comparator for a first integration duration;

selectively coupling, by the switching circuitry, the incoming signal to the comparator through the second integrator in a second branch when the excitation signal falls, wherein the second integrator is selectively coupled to the comparator for a second integration duration;

generating, by the comparator, an output signal;

selectively coupling, by the switching circuitry, a balancing feedback loop from the output signal of the comparator to the first branch when the excitation signal rises and to the second branch when the excitation signal falls;

generating a count of the output signal;

demodulating the count by multiplying the count by sine data coherent to the excitation signal to obtain a demodulated signal; and accumulating the demodulated signal to obtain a quantization error accumulation, wherein the quantization error accumulation is indicative of a capacitance, and wherein each of the first integration duration and the second integration duration is directly proportional to a sensing resolution of the touch sensor.

18. The method of claim 17, wherein accumulating the demodulated signal comprises:

generating samples of the output signal; and accumulating the samples over a plurality of periods of the excitation signal to obtain the quantization error accumulation that is indicative of the capacitance; and down-sampling the quantization error accumulation to obtain a digital value, wherein the digital value is indicative of the capacitance.

19. The method of claim 17, wherein:

selectively coupling the incoming signal to the comparator through the first integrator comprises controlling a first switch and a second switch to couple an input node and the comparator to a first node coupled to a first integrator capacitor; and selectively coupling the incoming signal to the comparator through the second integrator comprises controlling the first switch and the second switch to couple the input node and the comparator to a second node coupled to a second integrator capacitor.

20. The method of claim 19, wherein selectively coupling the balancing feedback loop from the output signal of the comparator to the first branch and to the second branch comprises:

controlling a third switch to couple a third node to the first node or the second node; and controlling a fourth switch to couple a first current source or a second current source to the third node based on the output signal.

* * * * *